United States Patent
Lee et al.

(10) Patent No.: US 9,711,482 B2
(45) Date of Patent: Jul. 18, 2017

(54) SEMICONDUCTOR PACKAGE EMBEDDED WITH PLURALITY OF CHIPS AND METHOD OF MANUFACTURING THE SAME

(71) Applicant: SK hynix Inc., Icheon-si, Gyeonggi-do (KR)

(72) Inventors: Sang Eun Lee, Chuncheon-si (KR); Eun Ko, Seoul (KR); Yong Jae Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 9 days.

(21) Appl. No.: 14/951,727

(22) Filed: Nov. 25, 2015

(65) Prior Publication Data
US 2017/0062384 A1    Mar. 2, 2017

(30) Foreign Application Priority Data
Sep. 2, 2015  (KR) .......................... 10-2015-0123939

(51) Int. Cl.
*H01L 23/00*        (2006.01)
*H01L 23/498*       (2006.01)
(Continued)

(52) U.S. Cl.
CPC .......... *H01L 24/73* (2013.01); *H01L 23/3675* (2013.01); *H01L 23/49811* (2013.01);
(Continued)

(58) Field of Classification Search
CPC ..... H01L 21/50; H01L 21/56; H01L 21/4803; H01L 23/49816; H01L 24/97
See application file for complete search history.

(56) References Cited

U.S. PATENT DOCUMENTS

| 2003/0153123 A1* | 8/2003 | Tsai ........................ H01L 24/97 438/107 |
| 2004/0110323 A1* | 6/2004 | Becker .................... H01L 21/56 438/127 |

(Continued)

FOREIGN PATENT DOCUMENTS

KR        1020090135201 A        12/2009

*Primary Examiner* — Kenneth Parker
*Assistant Examiner* — Fang-Xing Jiang
(74) *Attorney, Agent, or Firm* — William Park & Associates Ltd.

(57) ABSTRACT

A semiconductor package may include first semiconductor chips disposed in a rotationally symmetrical structure. First bonding pads are arranged over the bottom surfaces of the first semiconductor chips. The semiconductor package may also include a first encapsulation member formed to surround at least side surfaces of the first semiconductor chips. The semiconductor package may also include via patterns formed in the first encapsulation member. The semiconductor package may also include second semiconductor chips stacked over top surfaces of the first semiconductor chips and the first encapsulation member including the via patterns in such a way as to form step shapes with the first semiconductor chips. Second bonding pads electrically connected to the via patterns are arranged over bottom surfaces of the second semiconductor chips. The semiconductor package may also include a second encapsulation member formed over the top surfaces of the first semiconductor chips and the first encapsulation member to surround at least side surfaces of the second semiconductor chips.

10 Claims, 9 Drawing Sheets

(51) Int. Cl.
  *H01L 23/367* (2006.01)
  *H01L 23/538* (2006.01)
  *H01L 23/31* (2006.01)
  *H01L 21/56* (2006.01)

(52) U.S. Cl.
  CPC .. *H01L 23/49827* (2013.01); *H01L 23/49838* (2013.01); *H01L 23/5389* (2013.01); *H01L 24/19* (2013.01); *H01L 24/20* (2013.01); *H01L 24/96* (2013.01); *H01L 21/568* (2013.01); *H01L 23/3121* (2013.01); *H01L 24/32* (2013.01); *H01L 2224/0401* (2013.01); *H01L 2224/04105* (2013.01); *H01L 2224/12105* (2013.01); *H01L 2224/16227* (2013.01); *H01L 2224/16235* (2013.01); *H01L 2224/32145* (2013.01); *H01L 2224/32245* (2013.01); *H01L 2224/73203* (2013.01); *H01L 2224/73253* (2013.01); *H01L 2224/73267* (2013.01); *H01L 2224/81005* (2013.01); *H01L 2224/83005* (2013.01); *H01L 2924/15311* (2013.01); *H01L 2924/18161* (2013.01)

(56) References Cited

U.S. PATENT DOCUMENTS

| | | | |
|---|---|---|---|
| 2007/0035033 A1* | 2/2007 | Ozguz | H01L 21/4803 257/777 |
| 2008/0036050 A1* | 2/2008 | Lin | H01L 21/50 257/659 |
| 2010/0193930 A1* | 8/2010 | Lee | H01L 23/49816 257/686 |
| 2014/0225248 A1 | 8/2014 | Henderson et al. | |

\* cited by examiner

SEMICONDUCTOR PACKAGE EMBEDDED WITH PLURALITY OF CHIPS AND METHOD OF MANUFACTURING THE SAME

CROSS-REFERENCE TO RELATED APPLICATION

The present application claims priority under 35 U.S.C. §119(a) to Korean Patent Application No. 10-2015-0123939 filed in the Korean Intellectual Property Office on Sep. 2, 2015, which is incorporated herein by reference in its entirety.

BACKGROUND

1. Technical Field

Various embodiments generally relate to a semiconductor package, and more particularly to a semiconductor package embedded with a plurality of chips and a method of manufacturing the same.

2. Related Art

With broadening uses of high-performance mobile devices, the efforts to highly integrate semiconductor devices and improve the performance thereof continue. In order to highly integrate semiconductor devices, manufacturers in the semiconductor industry have been trying to scale semiconductor technologies down to the atomic scale.

In addition to that, semiconductor manufacturers have developed several packaging schemes, which include mounting two or more semiconductor dice on one substrate and vertically stacking two or more substrates on top of the other. Recently, a through-silicon via (TSV) is used to connect multiple semiconductor dice or substrates together in a package.

SUMMARY

In an embodiment, a semiconductor package may include first semiconductor chips disposed in a rotationally symmetrical structure, and having bottom surfaces over which first bonding pads are arranged. The semiconductor package may include a first encapsulation member formed to surround at least side surfaces of the first semiconductor chips. The semiconductor package may include a plurality of via patterns formed in the first encapsulation member. The semiconductor package may include second semiconductor chips stacked over top surfaces of the first semiconductor chips and the first encapsulation member including the via patterns in such a way as to form step shapes with the first semiconductor chips, and having bottom surfaces over which second bonding pads electrically connected with the via patterns are arranged. The semiconductor package may include a second encapsulation member formed over the top surfaces of the first semiconductor chips and the first encapsulation member to surround at least side surfaces of the second semiconductor chips.

In an embodiment, a semiconductor package may include first semiconductor chips disposed in a rotationally symmetrical structure, and having bottom surfaces over which first bonding pads are arranged. The semiconductor package may include interposers disposed over side surfaces, respectively, of the first semiconductor chips, and including a plurality of through electrodes. The semiconductor package may include a first encapsulation member formed to surround at least side surfaces of the first semiconductor chips and the interposers. The semiconductor package may include second semiconductor chips stacked over top surfaces of the first semiconductor chips, the first encapsulation member and the interposers in such a way as to form step shapes with the first semiconductor chips, and having bottom surfaces over which second bonding pads electrically connected with the through electrodes of the interposers are arranged. The semiconductor package may include a second encapsulation member formed to cover the top surfaces of the first semiconductor chips, the first encapsulation member and side surfaces of the second semiconductor chips.

In an embodiment, a method of manufacturing a semiconductor package may include: disposing first semiconductor chips having bottom surfaces over which first bonding pads are arranged, over a carrier in a rotationally symmetrical structure; forming a first encapsulation member over the carrier to surround at least side surfaces of the first semiconductor chips; forming a plurality of via patterns in the first encapsulation member; disposing second semiconductor chips having bottom surfaces over which second bonding pads are arranged, over portions of the first semiconductor chips and the first encapsulation member in which the via patterns are disposed, such that the second semiconductor chips are stacked to form step shapes with the first semiconductor chips and the second bonding pads are electrically connected with the via patterns; forming a second encapsulation member over the first semiconductor chips and the first encapsulation member to surround at least side surfaces of the second semiconductor chips; and removing the carrier.

In an embodiment, a method of manufacturing a semiconductor package may include: disposing first semiconductor chips having bottom surfaces over which first bonding pads are arranged, over a carrier in a rotationally symmetrical structure; disposing interposers each of which has a plurality of through electrodes, over portions of the carrier on sides of the first semiconductor chips; forming a first encapsulation member over the carrier to surround at least side surfaces of the first semiconductor chips and the interposers; disposing second semiconductor chips having bottom surfaces over which second bonding pads are arranged, over the first semiconductor chips, the interposers and the first encapsulation member, such that the second semiconductor chips are stacked to form step shapes with the first semiconductor chips and the second bonding pads are electrically connected with the through electrodes of the interposers; forming a second encapsulation member over the first semiconductor chips and the first encapsulation member to surround at least side surfaces of the second semiconductor chips; and removing the carrier.

In an embodiment, an electronic system applied with a semiconductor package may include a controller, an interface, an input/output unit and a memory device which are coupled by a bus, and the controller and the memory device may include a semiconductor package including: first semiconductor chips disposed in a rotationally symmetrical structure, and having bottom surfaces over which first bonding pads are arranged; a first encapsulation member formed to surround at least side surfaces of the first semiconductor chips; a plurality of via patterns formed in the first encapsulation member; second semiconductor chips stacked over top surfaces of the first semiconductor chips and the first encapsulation member including the via patterns in such a way as to form step shapes with the first semiconductor chips, and having bottom surfaces over which second bonding pads electrically connected with the via patterns are arranged; and a second encapsulation member formed over the top surfaces of the first semiconductor chips and the first encapsulation member to surround at least side surfaces of the second semiconductor chips.

In an embodiment, a memory card including a semiconductor package may include a memory which includes a semiconductor package and a memory controller which controls the memory, and the semiconductor package may include: first semiconductor chips disposed in a rotationally symmetrical structure, and having bottom surfaces over which first bonding pads are arranged; a first encapsulation member formed to surround at least side surfaces of the first semiconductor chips; a plurality of via patterns formed in the first encapsulation member; second semiconductor chips stacked over top surfaces of the first semiconductor chips and the first encapsulation member including the via patterns in such a way as to form step shapes with the first semiconductor chips, and having bottom surfaces over which second bonding pads electrically connected with the via patterns are arranged; and a second encapsulation member formed over the top surfaces of the first semiconductor chips and the first encapsulation member to surround at least side surfaces of the second semiconductor chips.

DETAILED DESCRIPTION

Hereinafter, a semiconductor package embedded with a plurality of chips and a method of manufacturing the same will be described below with reference to the accompanying drawings through various examples of embodiments.

Figure 1:
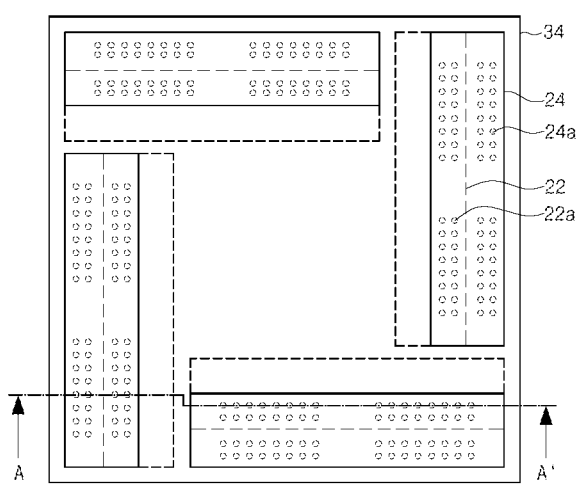
FIG. 1 is a plan view illustrating a semiconductor package in accordance with an embodiment.
Figure 2:
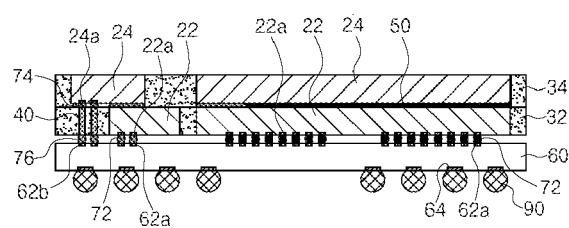
FIG. 2 is a cross-sectional view taken along the line A-A' of FIG. 1.

Referring to FIGS. 1 and 2, a semiconductor package 100 in accordance with an embodiment may include a plurality of first and second semiconductor chips 22 and 24, first and second encapsulation members 32 and 34, and a plurality of via patterns 40. Also, the semiconductor package 100 in accordance with the embodiment may include an adhesive member 50 and second bumps 74. In addition, the semiconductor package 100 in accordance with the embodiment may further include a substrate 60, first and third bumps 72 and 76, and external connection members 90.

The first semiconductor chips 22 may be memory chips. The first semiconductor chips 22 may have a rectangular plate shape. Each of the first semiconductor chips 22 may have a bottom surface and a top surface facing away from one another. The first semiconductor chips 22 may include a plurality of first bonding pads 22a arranged over the bottom surfaces of the first semiconductor chips 22. The first bonding pads 22a may be arranged adjacent to an edge (e.g., long edge) on the bottom surface of the first semiconductor chip 22. The first bonding pads 22a may be arranged in the direction in which the edge extends. For example, the first bonding pads 22a may be arranged such that two groups of the first bonding pads 22a each having two rows are arranged in the direction in which the edge extends and the two groups are spaced apart at a certain distance from one another. In an embodiment, the first bonding pads 22a may be arranged in a way that forms a coarse pitch. In an embodiment, the semiconductor package 100 may include four first semiconductor chips 22 each having rectangular plate shape, and the four first semiconductor chips 22 may be arranged in a rotationally symmetrical structure when viewed from above. The first semiconductor chips 22 may be disposed in a face-down type in which the first bonding pads 22a are disposed on the bottom surfaces of the first semiconductor chips 22.

The first encapsulation member 32 may be formed to surround at least the side surfaces of the first semiconductor chips 22 which are arranged in the rotationally symmetrical structure. When viewed from above, the first encapsulation member 32 may form a square shape if it is viewed together with the first semiconductor chips 22. The first encapsulation member 32 may be formed of an epoxy molding compound or a prepreg.

The plurality of via patterns 40 may be formed in the first encapsulation member 32 according to a through mold via process. In an embodiment, the via patterns 40 may be formed to electrically connect the second semiconductor chips 24 stacked on the first semiconductor chips 22 to the substrate 60. The via patterns 40 may be respectively formed in certain portions of the first encapsulation member 32, which corresponds to second bonding pads 24a of the second semiconductor chips 24. The via patterns 40 may be formed by forming via holes in the first encapsulation member 32 and then filling the via holes with a conductive material.

The second semiconductor chips 24 may be memory chips. The second semiconductor chips 24 may have a rectangular plate shape. Each of the second semiconductor chips 24 may have a bottom surface and a top surface facing away from one another. The second semiconductor chips 24 may include a plurality of second bonding pads 24a arranged over the bottom surfaces of the second semiconductor chips 24. The second bonding pads 24a may be arranged adjacent to an edge (e.g., long edge) on the bottom surface of the second semiconductor chip 24. The second bonding pads 24a may be arranged in the direction in which the edge extends. For example, the second bonding pads 24a may be arranged such that two groups of second bonding pads 24a each having two rows are arranged in the direction in which the edge extends and the two groups are spaced apart at a certain distance from one another. In an embodiment, the second bonding pads 24a may be arranged in a way that forms a coarse pitch.

In an embodiment, the semiconductor package 100 may include four second semiconductor chips 24. The four second semiconductor chips 24 may be stacked on the first encapsulation member 32 including the first semiconductor chips 22 and the via patterns 40 in such a way as to form step shapes in cooperation with the first semiconductor chips 22 respectively corresponding thereto. In detail, the second semiconductor chips 24 having the rectangular plate shape may be stacked on the first semiconductor chips 22 having the same shape as the second semiconductor chips 24 in such a manner that the long edges of the first semiconductor chips 22 and the second semiconductor chips 24 are placed apart from each other by a certain distance to form the step shapes. Also, the second semiconductor chips 24 may be arranged in a rotationally symmetrical structure when viewed from above. The second bonding pads 24a arranged on the bottom surfaces of the second semiconductor chips 24 may be exposed from the first semiconductor chips 22. The second bonding pads 24a of the second semiconductor chips 24 exposed from the first semiconductor chips 22 may be electrically connected to the upper ends of the via patterns 40 respectively corresponding thereto.

The second encapsulation member 34 may be formed to surround at least the side surfaces of the second semiconductor chips 24 which are arranged in the rotationally symmetrical structure on the first encapsulation member 32 and the first semiconductor chips 22. When viewed from above, the second encapsulation member 34 may form a square shape if it is viewed together with the second semiconductor chips 24. The second encapsulation member 34 may be formed of an epoxy molding compound or a prepreg.

The adhesive member 50 may be interposed between the first semiconductor chips 22 and the second semiconductor chips 24. The adhesive member 50 may be interposed in an area where the first semiconductor chips 22 is brought in contact with the second semiconductor chips 24. The adhesive member 50 functions to stick the second semiconductor chips 24 to the first semiconductor chips 22. The adhesive member 50 may be formed of an adhesive film or an adhesive paste.

The second bumps 74 may be formed on the second bonding pads 24a of the second semiconductor chips 24. The second bumps 74 may be formed on the second bonding pads 24a of the second semiconductor chips 24 before the process that disposes the second semiconductor chips 24 on the first semiconductor chips 22 and the first encapsulation member 32. Accordingly, when the second semiconductor chips 24 are arranged on the first semiconductor chips 22 and the first encapsulation member 32, the second bumps 74 are coupled to the upper ends of the via patterns 40. As a result, the second bonding pads 24a of the second semiconductor chips 24 and the via patterns 40 corresponding to each other may be electrically connected to each other.

The substrate 60 may be a printed circuit board (PCB). The substrate 60 may have a quadrangular plate shape when viewed from above. The substrate 60 may have a size corresponding to a size that includes the first semiconductor chips 22 arranged in the rotationally symmetrical structure and the first encapsulation member 32 formed to surround the side surfaces of the first semiconductor chips 22. The substrate 60 may include a plurality of first and second bond fingers 62a and 62b, which are arranged on the top surface of the substrate 60 facing the first semiconductor chips 22 and the first encapsulation member 32 and are electrically connected to the first bonding pads 22a of the first semiconductor chips 22 and the via patterns 40, respectively.

Also, the substrate 60 may include a plurality of ball lands 64 arranged on the bottom surface of the substrate 60 facing away from the top surface.

In an embodiment, the substrate 60 may include a plurality of conductor lines formed on the top surface and the bottom surface thereof and vias formed therein, and the first and second bond fingers 62a and 62b and the ball lands 64 may be electrically connected to each other by the conductor lines and the vias. The substrate 60 may further include solder resists formed on the top surface and the bottom surface in such a way as to expose the first and second bond fingers 62a and 62b and the ball lands 64.

The first bumps 72 may be respectively formed on the first bonding pads 22a of the first semiconductor chips 22, and the third bumps 76 may be respectively formed on the lower ends of the via patterns 40. The first bumps 72 and the third bumps 76 may be formed on the first bonding pads 22a and the lower ends of the via patterns 40 before the process that electrically connect the first semiconductor chips 22 to the substrate 60. Accordingly, the first semiconductor chips 22 and the substrate 60 may be connected to each other by the first bumps 72 and the third bumps 76. The first bonding pads 22a of the first semiconductor chips 22 and the first bond fingers 62a of the substrate 60 may be electrically connected to each other through the first bumps 72, and the via patterns 40 and the second bond fingers 62b of the substrate 60 may be electrically connected to each other by the third bumps 76.

The external connection members 90 may be respectively formed on the ball lands 64 arranged on the bottom surface of the substrate 60. The external connection members 90 may include solder balls. In another embodiment, the external connection members 90 may include conductive pastes or conductive pins.

As described above, the semiconductor package in accordance with an embodiment includes first and second semiconductor chips arranged in a rotationally symmetrical structure, and when viewed from above, the positions of the second semiconductor chips placed in the upper level of the semiconductor package do not correspond to the positions of the first semiconductor chips placed in the lower level of the semiconductor package. The second semiconductor chips are disposed on the first semiconductor chips in such a way as to form step shapes. As a result, an interconnect between semiconductor chips placed in the upper level and semiconductor chips placed in the lower level may be formed while minimizing the use of TSVs, which may cause the process complexity and an increase in manufacturing costs. In the semiconductor package in accordance with an embodiment, the interconnect between semiconductor chips placed in the upper level and semiconductor chips placed in the lower level may be formed by using via patterns, which do not cause the process complexity but rather ensure the process easiness and reliability. In an embodiment, an electrical connection between the second semiconductor chips and a substrate may be formed in a first encapsulation member, and thus the interconnect between semiconductor chips placed in the upper level and semiconductor chips placed in the lower level may be formed while minimizing the use of TSVs.

When vertically stacking at least two semiconductor chips, TSVs are needed to connect input/output terminals (e.g., bonding pads) thereof, and thus it is required for an area where the TSVs are formed to be aligned with respect to an upper chip and a lower chip. In the embodiment, since upper chips are disposed on lower chips in such a way as to form step shapes, it is possible to avoid the formation of TSVs in some areas.

In addition, various embodiments of the present invention may allow a large number of semiconductor chips to be efficiently mounted in the semiconductor package.

The semiconductor package 100 in accordance with an embodiment may be manufactured as described below.

Figure 3A:
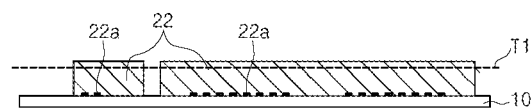
FIGS. 3A to 3F are cross-sectional views provided to explain a method of manufacturing a semiconductor package in accordance with an embodiment.

Referring to FIG. 3A, a carrier 10 is prepared. The carrier 10 may include an insulation tape, an insulation substrate, a glass substrate, or a bare wafer, which is not formed with a circuit. First semiconductor chips 22 are disposed on the carrier 10. Each of the first semiconductor chips 22 may have a rectangular plate shape, and include a plurality of first bonding pads 22a arranged adjacent to an edge on the bottom surface of the first semiconductor chip 22. In an embodiment, the first bonding pads 22a may be arranged in the direction in which the edge extends. The first semiconductor chips 22 are disposed on the carrier 10 such that bottom surfaces on which first bonding pads 22a are formed face the carrier 10, and four first semiconductor chips 22 are arranged in a rotationally symmetrical structure when viewed from above. The reference symbol T1 represents a first target thickness to be subsequently removed.

Figure 3B:
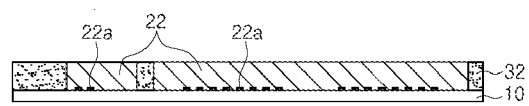

Referring to FIG. 3B, a first encapsulation member 32 is formed on the carrier 10 to cover the first semiconductor chips 22. The first encapsulation member 32 may be formed of an epoxy molding compound or a prepreg. The first encapsulation member 32 is formed to cover not only the side surfaces but also the top surfaces of the first semiconductor chips 22. The first encapsulation member 32 and the first semiconductor chips 22 are removed up to the first target thickness T1, and the first semiconductor chips 22 are exposed.

Figure 3C:
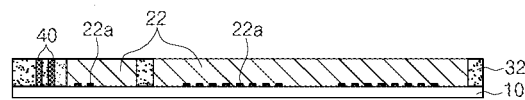

Referring to FIG. 3C, a plurality of via holes vertically passing through the first encapsulation member 32 are formed in the first encapsulation member 32 through an etching process. The via holes may be formed at positions respectively corresponding to second bonding pads of second semiconductor chips which are to be subsequently disposed on the first semiconductor chips 22 and the first encapsulation member 32. The via holes may be formed through photo and etching processes. The via holes may be formed through a laser drilling process. By depositing a conductive material on the first encapsulation member 32 and the first semiconductor chips 22 to fill the via holes with the conductive material and then etching back, grinding, or chemical-mechanical polishing (CMP) the conductive material to expose the first semiconductor chips 22 and the first encapsulation member 32, via patterns 40 are formed in the via holes. The conductive material may be a metal layer such as a copper layer.

The via patterns 40 may be formed in such a way as not to completely fill the via holes but to leave the upper end portions of the via holes unfilled. The via patterns 40 may be formed by filling the via holes with a conductive material such as a solder in the via holes except the upper end portions of the via holes.

Figure 3D:
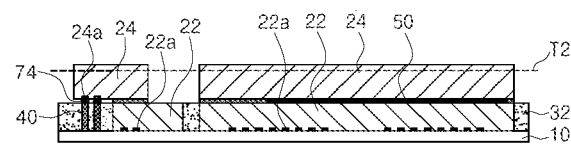

Referring to FIG. 3D, second semiconductor chips 24 are arranged on the first semiconductor chips 22 and the first encapsulation member 32, which is formed with the plurality of via patterns 40. In the same manner as the first semiconductor chips 22, four second semiconductor chips 24 are arranged in a rotationally symmetrical structure when viewed from above. The second semiconductor chips 24 are stacked on the first semiconductor chips 22 respectively corresponding thereto in such a way as to form step shapes.

Each of the second semiconductor chips 24 has a rectangular plate shape, and includes a plurality of second bonding pads 24a arranged adjacent to an edge on the bottom surface of the second semiconductor chip 24. In an embodiment, the second bonding pads 24a may be arranged in the direction in which the edge extends. The second semiconductor chips 24 are disposed such that bottom surfaces on which second bonding pads 24a are arranged face the first semiconductor chips 22 and the first encapsulation member 32. Further, the second semiconductor chips 24 are disposed on the first semiconductor chips 22 respectively corresponding thereto in such a manner that the edges (e.g., long edges) of the first semiconductor chips 22 and the second semiconductor chips 24 are placed apart from each other by a certain distance to form the step shapes and thereby the second bonding pads 24a of the second semiconductor chips 24 are exposed from the first semiconductor chips 22.

Before the process that disposes the second semiconductor chips 24, second bumps 74 may be respectively formed on the second bonding pads 24a of the second semiconductor chips 24, and after the second semiconductor chips 24 are arranged, the second bonding pads 24a of the second semiconductor chips 24 and the via patterns 40 are electrically connected to each other by the second bumps 74. The reference symbol T2 represents a second target thickness to be subsequently removed.

In a case where the via patterns 40 are formed in the via holes in such a way that leaves the upper end portions of the via holes unfilled, the second bumps 74 are inserted into the upper ends of the recessed via holes and are electrically connected to the via patterns 40.

Figure 3E:
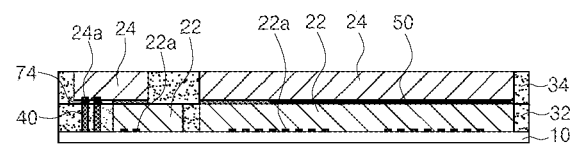

Referring to FIG. 3E, a second encapsulation member 34 is formed on the first semiconductor chips 22, the first encapsulation member 32 and the second semiconductor chips 24 to cover the second semiconductor chips 24. The second encapsulation member 34 may be formed of an epoxy molding compound or a prepreg. The second encapsulation member 34 is formed to cover the top surfaces of the second semiconductor chips 24. Then, the second encapsulation member 34 is removed together with the second semiconductor chips 24 up to the second target thickness T2, such that the top surfaces of the second semiconductor chips 24 are exposed. As a result, the second encapsulation member 34 surrounds only the side surfaces of the second semiconductor chips 24.

Figure 3F:
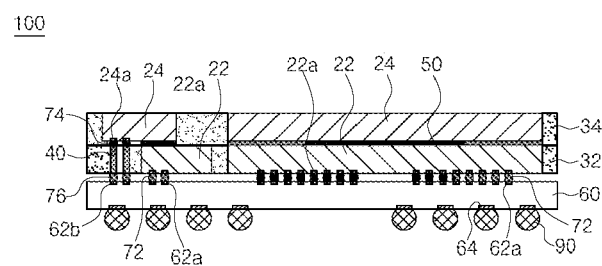

Referring to FIG. 3F, the carrier 10 is removed such that the bottom surfaces of the first semiconductor chips 22 including the first bonding pads 22a and the bottom surface of the first encapsulation member 32 including the lower ends of the via patterns 40 are exposed. First bumps 72 are formed on the first bonding pads 22a, which are exposed, and third bumps 76 are formed on the lower ends of the via patterns 40, which are exposed.

A substrate 60 having a top surface on which a plurality of first and second bond fingers 62a and 62b are arranged and a bottom surface on which a plurality of ball lands 64 are arranged is prepared. The substrate 60 is attached to the bottom surfaces of the first semiconductor chips 22 and the first encapsulation member 32 by the medium of the first bumps 72 and the third bumps 76. As a result, the first bonding pads 22a of the first semiconductor chips 22 and the first bond fingers 62a of the substrate 60 are electrically connected to each other, and the via patterns 40 and the second bond fingers 62b of the substrate 60 are electrically connected to each other. The substrate 60 may have a size similar to a size that includes the first semiconductor chips 22 arranged in the rotationally symmetrical structure and the first encapsulation member 32 formed to surround the side surfaces of the first semiconductor chips 22. External connection members 90 such as solder balls are attached to the ball lands 64, which are arranged on the bottom surface of the substrate 60.

In order to protect the first semiconductor chips 22 and the first and third bumps 72 and 76, an underfill may be formed in the space between the first semiconductor chips 22 and the first encapsulation member 32 and the substrate 60, before forming the external connection members 90.

Figure 4:
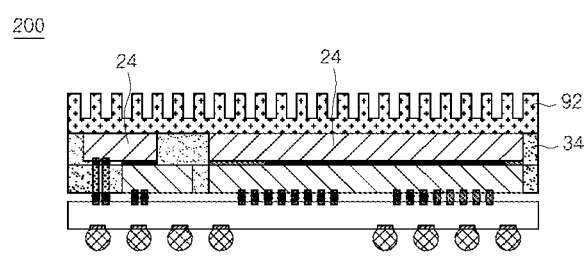
FIG. 4 is a cross-sectional view illustrating a semiconductor package in accordance with an embodiment.

Referring to FIG. 4, a semiconductor package 200 in accordance with an embodiment may further include a heat sink 92 attached to the top surfaces of second semiconductor chips 24 and a second encapsulation member 34, which are exposed. Accordingly, the semiconductor package 200 in accordance with an embodiment may have an improved heat dissipation characteristic when compared to the embodiment shown in FIG. 2.

In an embodiment, thermal interface material (TIM) may be interposed between the second semiconductor chips 24 and the heat sink 92.

The remaining components not described in the semiconductor package 200 in FIG. 4 may be the same as those of the aforementioned embodiments, and thus detailed descriptions thereof will be omitted herein.

Figure 5:
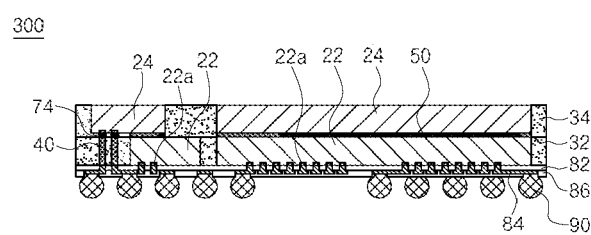
FIG. 5 is a cross-sectional view illustrating a semiconductor package in accordance with an embodiment.

Referring to FIG. 5, a semiconductor package 300 in accordance with an embodiment may include first and second semiconductor chips 22 and 24, first and second encapsulation members 32 and 34, and via patterns 40. Also, the semiconductor package 300 in accordance with an embodiment may include a first insulation layer 82, redistribution lines 84, and a second insulation layer 86. In addition, the semiconductor package 300 in accordance with an embodiment may further include an adhesive member 50, second bumps 74, and external connection members 90.

The first insulation layer 82 may be formed on the bottom surfaces of the first semiconductor chips 22 and the first encapsulation member 32. In an embodiment, the first insulation layer 82 may include holes formed in such a way as to respectively expose first bonding pads 22a arranged on the bottom surfaces of the first semiconductor chips 22 and the via patterns 40 formed to pass through the first encapsulation member 32.

The redistribution lines 84 may be formed of a metal with excellent electrical conductivity such as copper. The redistribution lines 84 may be formed on the first insulation layer 82, and one ends of the redistribution lines 84 may be respectively connected to the first bonding pads 22a and the via patterns 40, which are exposed. The redistribution lines 84 may be formed by depositing a copper layer on the first insulation layer 82 to fill the holes and then patterning the copper layer. The respective redistribution lines 84 may include terminal portions formed on the other ends facing away from the one ends.

The second insulation layer 86 may be formed on the redistribution lines 84 and the first insulation layer 82 in such a way as to expose the terminal portions of the redistribution lines 84.

The external connection members 90 may be formed of solder balls, and may be respectively attached to the terminal portions of the redistribution lines 84, which are exposed from the second insulation layer 86.

The remaining components not described in FIG. 5 may be the same as those of the aforementioned embodiments illustrated in FIGS. 2 and 4, and thus detailed descriptions thereof will be omitted herein.

The semiconductor package 300 in accordance with an embodiment may further include a heat sink attached to the second semiconductor chips 24 and the second encapsulation member 34 to have an improved heat dissipation characteristic.

Figure 6:
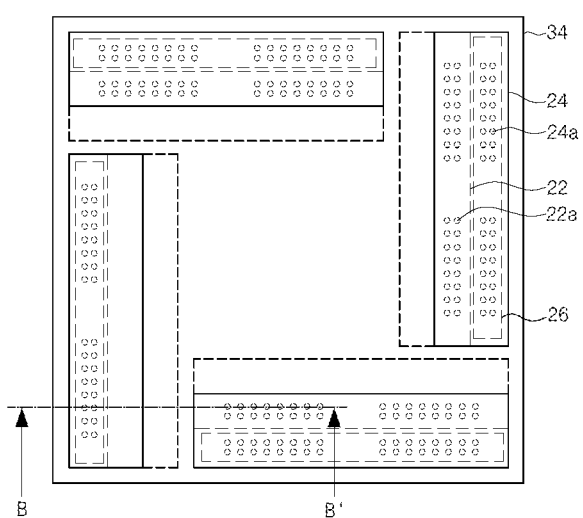
FIG. 6 is a plan view illustrating a semiconductor package in accordance with an embodiment.
Figure 7:
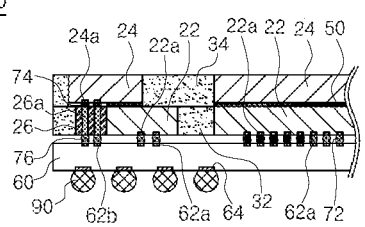
FIG. 7 is a cross-sectional view taken along the line B-B' of FIG. 6.

Referring to FIGS. 6 and 7, a semiconductor package 400 in accordance with an embodiment may include first and second semiconductor chips 22 and 24, interposers 26, and first and second encapsulation members 32 and 34. Also, the semiconductor package 400 in accordance with the embodiment may include an adhesive member 50 and second bumps 74. The semiconductor package 400 in accordance with the embodiment may further include a substrate 60, first and third bumps 72 and 76, and external connection members 90.

The first semiconductor chips 22 may be semiconductor memory chips and have a substantially rectangular plate shape. Four first semiconductor chips 22 may be arranged in a rotationally symmetrical structure when viewed from above. Each of the first semiconductor chips 22 may include a plurality of first bonding pads 22a arranged on the bottom surface of the first semiconductor chip 22. In an embodiment, the first bonding pads 22a may be arranged adjacent to an edge on the bottom surface of each first semiconductor chip 22 such that two groups of the first bonding pads 22a each having two rows are arranged in the direction in which the edge extends and the two groups are spaced apart at a certain distance from one another. In an embodiment, the first bonding pads 22a may be arranged in a way that forms a fine pitch.

The interposers 26 may be formed of an insulation material and have a rectangular plate shape. Each of the interposers 26 may include a plurality of through-electrodes 26a, and the through-electrodes 26a may be respectively formed in certain portions of the interposer 26 where second bonding pads 24a of the second semiconductor chips 24 are to be disposed.

The first encapsulation member 32 may be formed of an epoxy molding compound or a prepreg. The first encapsulation member 32 may be formed to surround at least the side surfaces of the first semiconductor chips 22 and the interposers 26.

The second semiconductor chips 24 may have a rectangular plate shape. Each of the second semiconductor chips 24 may include the plurality of second bonding pads 24a disposed on the bottom surface of the second semiconductor chip 24. Four second semiconductor chips 24 may be arranged in a rotationally symmetrical structure when viewed from above. The second semiconductor chips 24 may be respectively stacked on the first semiconductor chips 22 corresponding thereto in step shapes such that the second bonding pads 24a are exposed from the first semiconductor chips 22. The second semiconductor chips 24 may be attached to the first semiconductor chips 22, the interposers 26, and the first encapsulation member 32 by the medium of the adhesive member 50.

The second encapsulation member 34 may be formed to surround at least the side surfaces of the second semiconductor chips 24 arranged in the rotationally symmetrical structure. When viewed from above, the second encapsulation member 34 may form a square shape if it is viewed together with the second semiconductor chips 24. The second encapsulation member 34 may be formed of an epoxy molding compound or a prepreg.

The adhesive member 50 may be interposed between the first semiconductor chips 22 and the second semiconductor chips 24. The adhesive member 50 may function to stick the second semiconductor chips 24 to the first semiconductor chips 22.

The second bumps 74 may be formed on the second bonding pads 24a. The second bonding pads 24a and the through-electrodes 26a of the interposers 26 corresponding to each other may be electrically connected to each other by the second bumps 74.

The substrate 60 may have a quadrangular plate shape when viewed from above. The substrate 60 may include a plurality of first and second bond fingers 62a and 62b which are arranged on the top surface of the substrate 60 facing the first semiconductor chips 22, the interposers 26 and the first encapsulation member 32 and are electrically connected with the first bonding pads 22a of the first semiconductor chips 22 and the through-electrodes 26a of the interposers 26, respectively. The substrate 60 may include a plurality of ball lands 64, which are arranged on the bottom surface of the substrate 60 facing away from the top surface.

In an embodiment, the substrate 60 may include a plurality of conductor lines formed on the top surface and the bottom surface thereof and vias formed therein. The substrate 60 may further include solder resists formed on the top surface and the bottom surface in such a way as to expose the first and second bond fingers 62a and 62b and the ball lands 64.

The first bumps 72 may be respectively formed on the first bonding pads 22a of the first semiconductor chips 22, and the third bumps 76 may be respectively formed on the lower ends of the through-electrodes 26a. The first bumps 72 and the third bumps 76 may be formed on the first bonding pads 22a and the lower ends of the through-electrodes 26a before the process that electrically connect the first semiconductor chips 22 to the substrate 60. Accordingly, the first semiconductor chips 22 and the substrate 60 may be connected to each other by the first bumps 72 and the third bumps 76. The first bonding pads 22a of the first semiconductor chips 22 and the first bond fingers 62a of the substrate 60 may be electrically connected to each other through the first bumps 72, and the through-electrodes 26a of the interposers 26 and the second bond fingers 62b of the substrate 60 may be electrically connected to each other by the third bumps 76.

The external connection members 90 may be respectively formed on the ball lands 64 arranged on the bottom surface of the substrate 60. The external connection members 90 may include solder balls. In another embodiment, the external connection members 90 may include conductive pastes or conductive pins.

The semiconductor package 400 in accordance with an embodiment may be manufactured as described below.

Figure 8A:
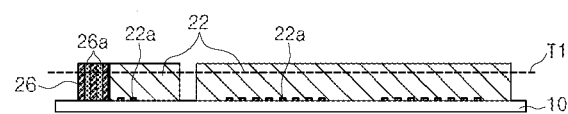
FIGS. 8A to 8E are cross-sectional views provided to explain a method of manufacturing a semiconductor package in accordance with an embodiment.

Referring to FIG. 8A, a carrier 10 is prepared. The carrier 10 may include an insulation tape, an insulation substrate, a glass substrate, or a bare wafer, which is not formed with a circuit. Four first semiconductor chips 22 having a rectangular plate shape are arranged on the carrier 10 in a rotationally symmetrical structure when viewed from above. Each of the first semiconductor chips 22 may include a plurality of first bonding pads 22a arranged on the bottom surface of the first semiconductor chip 22. The first semiconductor chips 22 are disposed in such a manner that bottom surfaces on which first bonding pads 22a are arranged face the carrier 10. Interposers 26 are respectively disposed on portions of the carrier 10 over which second semiconductor chips are to be subsequently disposed. Each of the interposers 26 includes a plurality of through-electrodes 26a, which are formed to pass through the interposer 26. Each of the interposers 26 may be placed in contact with the side surface of the first semiconductor chip 22 corresponding thereto. In another embodiment, each of the interposers 26 may be disposed to be spaced apart from the first semiconductor chip 22 corresponding thereto. The reference symbol T1 represents a first target thickness to be subsequently removed.

Figure 8B:

Referring to FIG. 8B, a first encapsulation member 32 is formed on the carrier 10 to cover the first semiconductor chips 22 and the interposers 26. The first encapsulation member 32 may be formed of an epoxy molding compound or a prepreg. The first encapsulation member 32, the interposers 26, and the first semiconductor chips 22 are removed up to the first target thickness T1, and the first semiconductor chips 22 are exposed.

Figure 8C:
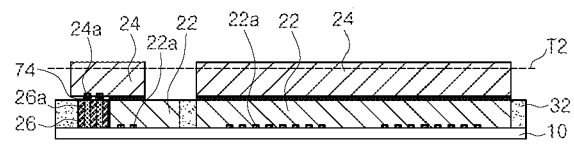

Referring to FIG. 8C, second semiconductor chips 24 are arranged on the first semiconductor chips 22, the interposers 26, and the first encapsulation member 32. In an embodiment, the second semiconductor chips 24 may have a rectangular plate shape in the same manner as the first semiconductor chips 22. Four second semiconductor chips 24 are arranged in a rotationally symmetrical structure when viewed from above. In an embodiment, the second semiconductor chips 24 are stacked on the first semiconductor chips 22 respectively corresponding thereto in step shapes, and are also stacked on the interposers 26. Each of the second semiconductor chips 24 includes a plurality of second bonding pads 24a arranged with a fine pitch on the bottom surface of the second semiconductor chip 24. The second semiconductor chips 24 are disposed such that bottom surfaces on which second bonding pads 24a are arranged face the first semiconductor chips 22, the interposers 26, and the first encapsulation member 32. Further, the second semiconductor chips 24 are disposed on the first semiconductor chips 22 respectively corresponding thereto in such a manner that the step shapes are formed, the second bonding pads 24a of the second semiconductor chips 24 are exposed from the first semiconductor chips 22, and the interposers 26 are completely covered.

Second bumps 74 may be formed on the second bonding pads 24a of the second semiconductor chips 24, and as a result, the second bonding pads 24a of the second semiconductor chips 24 and the through-electrodes 26a of the interposers 26 are electrically connected to each other. The reference symbol T2 represents a second target thickness to be subsequently removed.

Figure 8D:
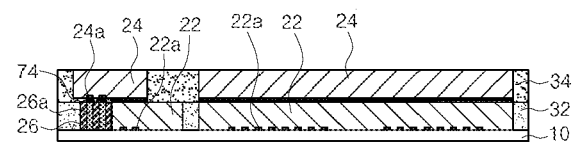

Referring to FIG. 8D, a second encapsulation member 34 is formed on the first semiconductor chips 22, the second semiconductor chips 24, and the first encapsulation member 32 to cover the second semiconductor chips 24. The second encapsulation member 34 may be formed of an epoxy molding compound or a prepreg. The second encapsulation member 34 and the second semiconductor chips 24 are removed up to the second target thickness T2, such that the top surfaces of the second semiconductor chips 24 are exposed. As a result, the second encapsulation member 34 surrounds only the side surfaces of the second semiconductor chips 24.

Figure 8E:
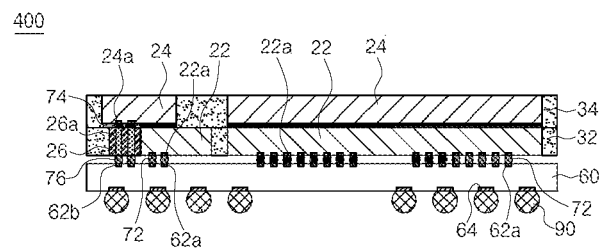

Referring to FIG. 8E, the carrier 10 is removed such that the bottom surfaces of the first semiconductor chips 22 including the first bonding pads 22a, the bottom surfaces of the interposers 26, and the bottom surface of the first encapsulation member 32 are exposed. First bumps 72 are formed on the first bonding pads 22a, which are exposed, and third bumps 76 are formed on the lower ends of the through-electrodes 26a, which are exposed. Next, a substrate 60 is prepared. The substrate 60 may have a top surface on which a plurality of first and second bond fingers 62a and 62b are arranged and a bottom surface on which a plurality of ball lands 64 are arranged. Then, the substrate 60 is attached to the bottom surfaces of the first semiconductor chips 22, the interposers 26, and the first encapsulation member 32 by the medium of the first bumps 72 and the third bumps 76. As a result, the first bonding pads 22a of the first semiconductor chips 22 and the first bond fingers 62a of the substrate 60 are electrically connected to each other, and the through-electrodes 26a of the interposers 26 and the second bond fingers 62b of the substrate 60 are electrically connected to each other.

The substrate 60 may have a size similar to a size that includes the first semiconductor chips 22 and the interposers 26 arranged in the rotationally symmetrical structure and the first encapsulation member 32 formed to surround the side surfaces of the first semiconductor chips 22. In another embodiment, the substrate 60 may have a size slightly smaller than a size that includes the first semiconductor chips 22, the interposers 26 and the first encapsulation member 32.

External connection members 90 such as solder balls are attached to the ball lands 64, which are arranged on the bottom surface of the substrate 60.

Figure 9:
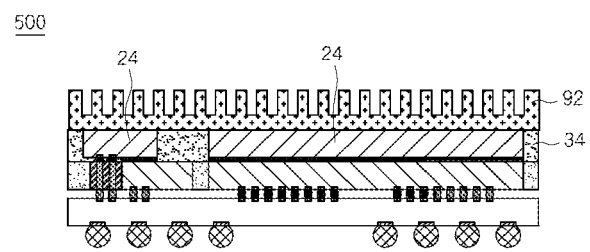
FIG. 9 is a cross-sectional view illustrating a semiconductor package in accordance with an embodiment.

Referring to FIG. 9, a semiconductor package 500 in accordance with an embodiment may further include a heat sink 92 attached to the top surfaces of second semiconductor chips 24 and a second encapsulation member 34, which are exposed. Accordingly, the semiconductor package 500 in accordance with an embodiment may have an improved heat dissipation characteristic when compared to the embodiment shown in FIG. 7.

In an embodiment, a TIM may be interposed between the second semiconductor chips 24 and the heat sink 92.

The remaining components not described in FIG. 9 may be the same as those of the embodiment shown in FIG. 7, and thus detailed descriptions thereof will be omitted herein.

Figure 10:
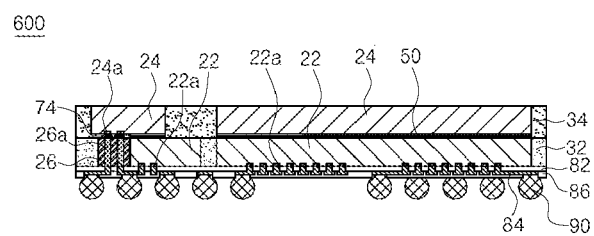
FIG. 10 is a cross-sectional view illustrating a semiconductor package in accordance with an embodiment.

Referring to FIG. 10, a semiconductor package 600 in accordance with an embodiment may include first and second semiconductor chips 22 and 24, interposers 26, and first and second encapsulation members 32 and 34. Also, the semiconductor package 600 in accordance with an embodiment may include a first insulation layer 82, redistribution lines 84, and a second insulation layer 86. The semiconductor package 600 in accordance with an embodiment may further include an adhesive member 50, second bumps 74, and external connection members 90.

The first insulation layer 82 may be formed on the bottom surfaces of the first semiconductor chips 22, the interposers 26, and the first encapsulation member 32. The first insulation layer 82 may include holes which are formed in such a way as to respectively expose first bonding pads 22a arranged on the bottom surfaces of the first semiconductor chips 22 and through-electrodes 26a formed in the interposers 26.

The redistribution lines 84 may be formed of a metal with excellent electrical conductivity such as copper. One ends of the redistribution lines 84 may be respectively connected to the first bonding pads 22a and the through-electrodes 26a, which are exposed. The respective redistribution lines 84 may include terminal portions formed on the other ends facing away from the one ends.

The second insulation layer 86 may be formed on the redistribution lines 84 and the first insulation layer 82 in such a way as to expose the terminal portions of the redistribution lines 84.

The external connection members 90 may be formed of solder balls, and may be respectively attached to the terminal portions of the redistribution lines 84 exposed from the second insulation layer 86.

The remaining components not described in FIG. 10 may be the same as those of the embodiment shown in FIG. 7, and thus detailed descriptions thereof will be omitted herein.

In another embodiment, the semiconductor package may further include a heat sink attached to the second semiconductor chips 24 and the second encapsulation member 34 to have an improved heat dissipation characteristic.

The semiconductor packages described above may be applied to various kinds of semiconductor devices and package modules including the same.

Figure 11:
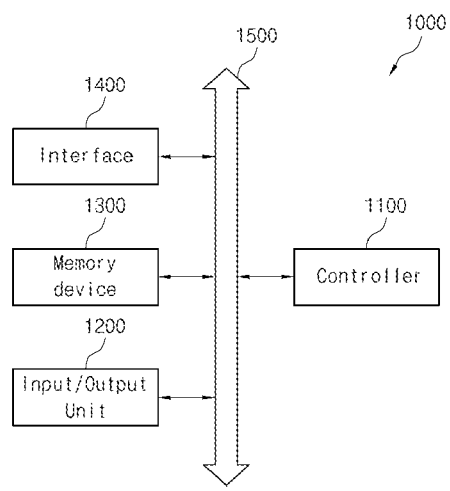
FIG. 11 is a block diagram illustrating an electronic system that includes semiconductor packages in accordance with various embodiments.

FIG. 11 is a block diagram illustrating an electronic system that includes semiconductor packages in accordance with various embodiments. As shown in the drawing, an electronic system 1000 may include a controller 1100, an input/output unit 1200, and a memory device 1300. The controller 1100, the input/output unit 1200 and the memory device 1300 may be electrically coupled to one another through a bus 1500, which provides data paths.

For example, the controller 1100 may include one or more of a microprocessor, a digital signal processor, a microcontroller, and logic devices capable of performing similar functions to these components. The controller 1100 and the memory device 1300 may include the semiconductor packages in accordance with various embodiments. The input/output unit 1200 may include one or more of a keypad, a keyboard, a display device, and so forth.

The memory device 1300 may store data and/or commands to be executed by the controller 1100. The memory device 1300 may include a volatile memory device such as a DRAM and/or a nonvolatile memory device such as a flash memory. For example, a flash memory may be mounted to an information processing system such as a mobile terminal and a desktop computer. Such a flash memory may be configured by a Solid State Drive (SSD). In this case, the electronic system 1000 may stably store a large amount of data in a flash memory system.

Such an electronic system 1000 may further include an interface 1400 for transmitting data to a communication network or receiving data from a communication network. The interface 1400 may be a wired or wireless type. For example, the interface 1400 may include an antenna or a wired/wireless transceiver.

Although not shown, the electronic system 1000 may further include an application chipset, a Camera Image Processor (CIP), and so forth. The electronic system 1000 may be realized as a mobile system, a personal computer, a computer for an industrial use or a logic system performing various functions.

For example, the mobile system may be any one selected between a Personal Digital Assistant (PDA), a portable computer, a web tablet, a mobile phone, a smart phone, a wireless phone, a laptop computer, a memory card, a digital music system, and an information transmission/reception system.

In a case where the electronic system 1000 is an equipment capable of performing wireless communication, the electronic system 1000 may be used in a communication system such as Code Division Multiple Access (CDMA), Global System for Mobile communication (GSM), North American Digital Cellular (NADC), Enhanced-Time Division Multiple Access (E-TDMA), Wideband Code Division Multiple Access (WCDMA), CDMA2000, Long Term Evolution (LTE) and Wireless Broadband Internet (Wibro).

Figure 12:
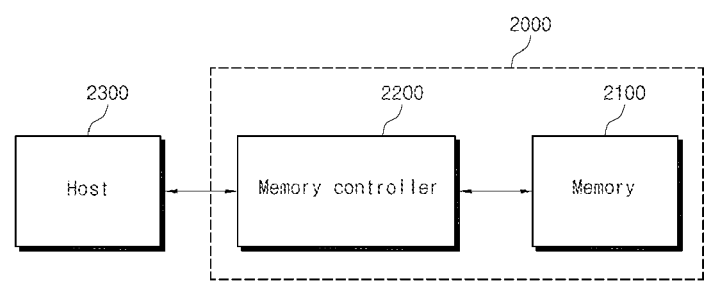
FIG. 12 is a block diagram illustrating a memory card that includes semiconductor packages in accordance with various embodiments.

FIG. 12 is a block diagram illustrating a memory card that includes semiconductor packages in accordance with various embodiments. As shown in the drawing, the semiconductor packages in accordance with various embodiments may be provided in the form of a memory card 2000. For instance, the memory card 2000 may include a memory 2100 such as a nonvolatile memory device and a memory controller 2200. The memory 2100 and the memory controller 2200 may store data or read stored data.

The memory 2100 may include one or more of nonvolatile memory devices to which the semiconductor packages in accordance with various embodiments are applied. The memory controller 2200 may control the memory 2100 to read stored data or store data in response to a read/write request from a host 2300.

While various embodiments have been described above, it will be understood to those skilled in the art that the embodiments described are by way of example only. Accordingly, the semiconductor package embedded with a plurality of chips and the method of manufacturing the same described herein should not be limited based on the described embodiments.

What is claimed is:

1. A semiconductor package comprising:
   first semiconductor chips disposed in a rotationally symmetrical structure, the first semiconductor chips including a plurality of first bonding pads arranged over the bottom surfaces of the first semiconductor chips, wherein the first bonding pads are arranged such that two groups of the first bonding pads each having two rows are arranged in a direction in which an edge of the first semiconductor chip extends and the two row groups are spaced apart at a certain distance from one another;
   a first encapsulation member formed to surround at least side surfaces of the first semiconductor chips;
   a plurality of via patterns formed in the first encapsulation member;
   second semiconductor chips stacked over top surfaces of the first semiconductor chips and the first encapsulation member including the via patterns in such a way as to form step shapes with the first semiconductor chips, the second semiconductor chips including a plurality of second bonding pads electrically connected to the via patterns and arranged over bottom surfaces of the second semiconductor chips, wherein the second bonding pads are arranged such that two groups of the second bonding pads each having two rows are arranged in the direction in which the edge extends and the two row groups are spaced apart at a certain distance from one another; and
   a second encapsulation member formed over the top surfaces of the first semiconductor chips and the first encapsulation member to surround at least side surfaces of the second semiconductor chips.

2. The semiconductor package according to claim 1, wherein four first semiconductor chips are disposed in the rotationally symmetrical structure when viewed from above.

3. The semiconductor package according to claim 1, wherein the first and second semiconductor chips have a rectangular plate shape and are stacked such that long edges of the first semiconductor chips and the second semiconductor chips are spaced apart from each other by a distance to form the step shapes.

4. The semiconductor package according to claim 1, further comprising:
   an adhesive member interposed between the first semiconductor chips and the second semiconductor chips.

5. The semiconductor package according to claim 1, further comprising:
   a substrate disposed over bottom surfaces of the first semiconductor chips and the first encapsulation member, wherein a top surface of the substrate faces the first semiconductor chips and a bottom surface of the substrate faces away from the top surface, and a plurality of first bond fingers are arranged over the top surface of the substrate and are electrically connected to the first bonding pads of the first semiconductor chips, and a plurality of second bond fingers are electrically connected to lower ends of the via patterns and a plurality of ball lands arranged over the bottom surface of the substrate.

6. The semiconductor package according to claim 5, further comprising:
   first bumps interposed between the first bonding pads of the first semiconductor chips and the first bond fingers of the substrate; and
   second bumps interposed between the lower ends of the via patterns and the second bond fingers of the substrate.

7. The semiconductor package according to claim 5, further comprising:
   external connection members attached to the ball lands of the substrate.

8. The semiconductor package according to claim 1, further comprising:
   third bumps interposed between the second bonding pads of the second semiconductor chips and the via patterns.

9. The semiconductor package according to claim 1, further comprising:
   a first insulation layer formed over the bottom surfaces of the first semiconductor chips and the first encapsulation member to expose the first bonding pads and the via patterns;
   redistribution lines formed over the first insulation layer to be electrically connected to the first bonding pads and the via patterns; a second insulation layer formed over the redistribution lines and the first insulation layer to expose portions of the redistribution lines; and
   external connection members respectively formed over the exposed portions of the redistribution lines.

10. The semiconductor package according to claim 1, further comprising:
    a heat sink formed over the second semiconductor chips and the second encapsulation member.

* * * * *